US005491614A

United States Patent [19]
Fowler et al.

[11] Patent Number: 5,491,614
[45] Date of Patent: Feb. 13, 1996

[54] CONTROL DEVICE AND METHOD OF MAKING THE SAME

[75] Inventors: Daniel L. Fowler, Kentwood; William S. Hayes, Holland, both of Mich.

[73] Assignee: Robertshaw Controls Company, Richmond, Va.

[21] Appl. No.: 413,590

[22] Filed: Mar. 30, 1995

Related U.S. Application Data

[62] Division of Ser. No. 56,350, Apr. 30, 1993, Pat. No. 5,408,385.

[51] Int. Cl.⁶ ..................................................... H05K 1/14
[52] U.S. Cl. ..................... 361/784; 361/752; 361/796; 361/748; 174/17 R; 174/50
[58] Field of Search ........................... 361/752, 796, 361/724, 736, 748, 784, 756; 174/17 R, 260, 50, 250

[56] References Cited

U.S. PATENT DOCUMENTS

| | | | |
|---|---|---|---|
| 4,868,715 | 9/1989 | Putman et al. | 361/422 |
| 4,956,750 | 9/1990 | Maggelet | 361/415 |
| 5,068,765 | 11/1991 | Nimpoeno | 361/422 |

*Primary Examiner*—Leo P. Picard
*Assistant Examiner*—Y. Whang
*Attorney, Agent, or Firm*—Fulbright & Jaworski

[57] ABSTRACT

A control device and method of making the same are provided, the control device comprising two generally flat and rectangular circuit boards each having a component carrying side and an opposite solder side, each circuit board having a peripheral edge, and mounting structure holding the two circuit boards in spaced apart generally parallel relation with certain sides thereof facing each other, the mounting structure comprising a bracket unit generally engaging and encircling the peripheral edges of the two circuit boards so as to generally close the space between the two circuit boards around generally the entire peripheral edges thereof.

20 Claims, 11 Drawing Sheets

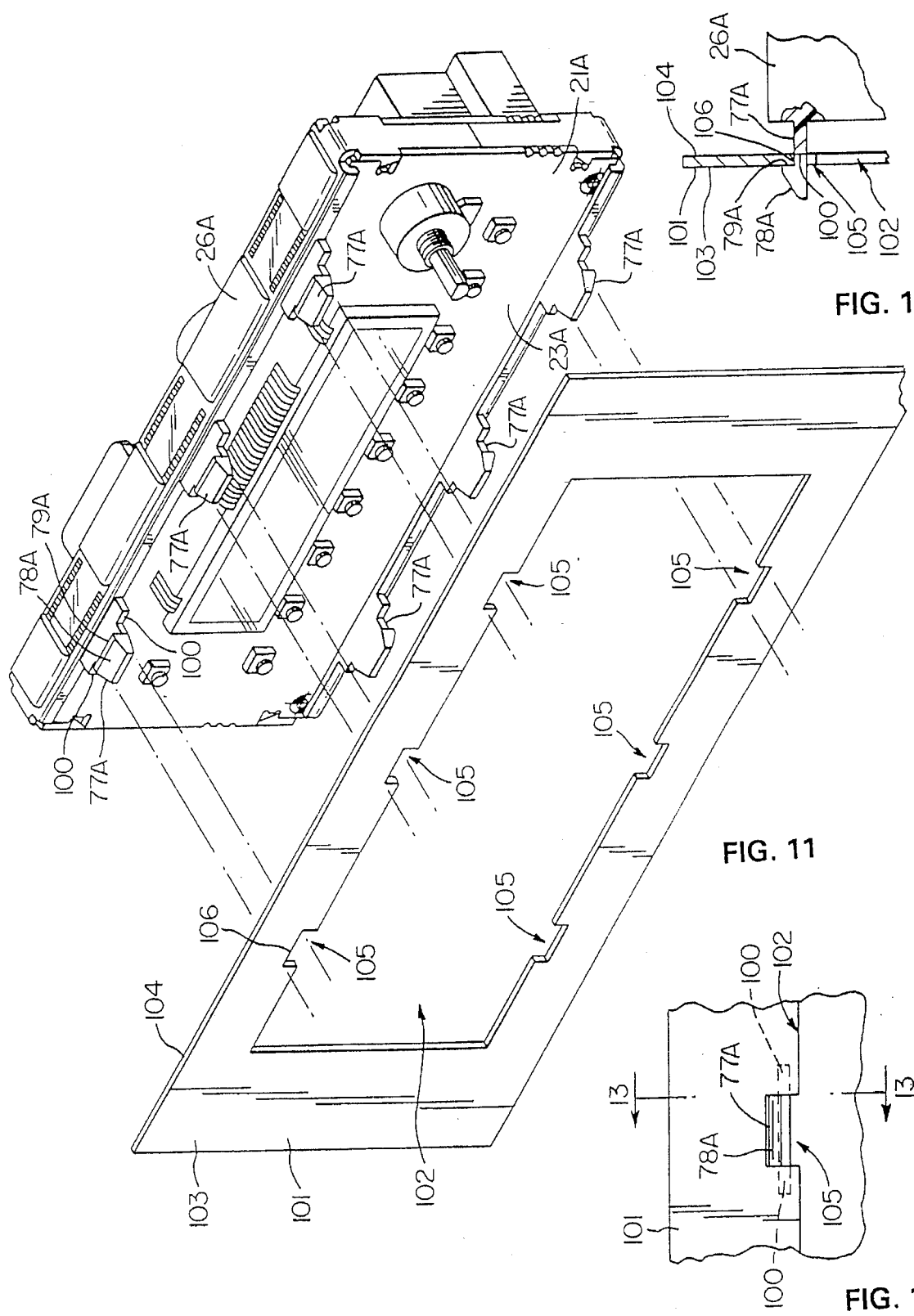

5,491,614

CONTROL DEVICE AND METHOD OF MAKING THE SAME

CROSS REFERENCE TO RELATED APPLICATIONS

This application is a divisional patent application of its parent patent application Ser. No. 056,350 filed Apr. 30, 1993, now U.S. Pat. No. 5,408,385.

BACKGROUND OF THE INVENTION

1. Field of the Invention

This invention relates to a new control device having unique means for holding the circuit boards thereof in spaced apart generally parallel relation and to a new method of making such a new control device.

2. Prior Art Statement

It is known to provide a control device comprising two generally flat and rectangular circuit boards each having a component carrying side and an opposite solder side, each circuit board having peripheral edge means, and mounting means holding the two circuit boards in spaced apart generally parallel relation with certain sides thereof facing each other, the mounting means comprising small spaced apart standoff items disposed about the peripheral edge means of the two boards, such as posts and the like.

SUMMARY OF THE INVENTION

It is one of the features of this invention to provide a new control device having unique mounting means holding the two circuit boards thereof in spaced apart generally parallel relation.

In particular, it was found according to the teachings of this invention that a mounting means can be provided that will not only hold the two circuit boards in the spaced apart generally parallel relation thereof, but also the mounting means can generally engage and encircle the peripheral edge means of the two circuit boards so as to generally close the space between the two circuit boards around generally the entire peripheral edge means thereof.

For example, one embodiment of this invention comprises a control device comprising two generally flat and rectangular circuit boards each having a component carrying side and an opposite solder side, each circuit board having peripheral edge means, and mounting means holding the two circuit boards in spaced apart generally parallel relation with certain sides thereof facing each other, the mounting means comprising bracket means generally engaging and encircling the peripheral edge means of the two circuit boards so as to generally close the space between the two circuit boards around generally the entire peripheral edge means thereof.

It is another feature of this invention to form the bracket means for a control device from a plurality of symmetrical bracket members.

For example, another embodiment of this invention comprises a control device comprising two generally flat and rectangular circuit boards each having a component carrying side and an opposite solder side, each circuit board having peripheral edge means, and mounting means holding the two circuit boards in spaced apart generally parallel relation with certain sides thereof facing each other, the mounting means comprising two like U-shaped bracket members each having a cross member and a pair of spaced apart substantially parallel legs provided with free ends facing the free ends of the other bracket member, the cross member and the legs of each bracket member engaging the peripheral edge means of the two circuit boards.

Accordingly, it is an object of this invention to provide a new control device having one or more of the novel features of this invention as set forth above or hereinafter shown or described.

Another object of this invention is to provide a new method of making such a control device, the method of this invention having one or more of the novel features of this invention as set forth above or hereinafter shown or described.

Other objects, uses and advantages of this invention are apparent from a reading of this description which proceeds with reference to the accompanying drawings forming a part thereof and wherein:

BRIEF DESCRIPTION OF THE DRAWINGS

FIG. 11 is a view similar to FIG. 10 and illustrates the control device of FIG. 2 with certain parts thereof being disposed in an exploded manner.

FIG. 12 is a fragmentary front view of part of the control device of FIG. 2.

FIG. 13 is a fragmentary cross-sectional view taken on line 13—13 of FIG. 12.

DESCRIPTION OF THE PREFERRED EMBODIMENTS

Figure 1:
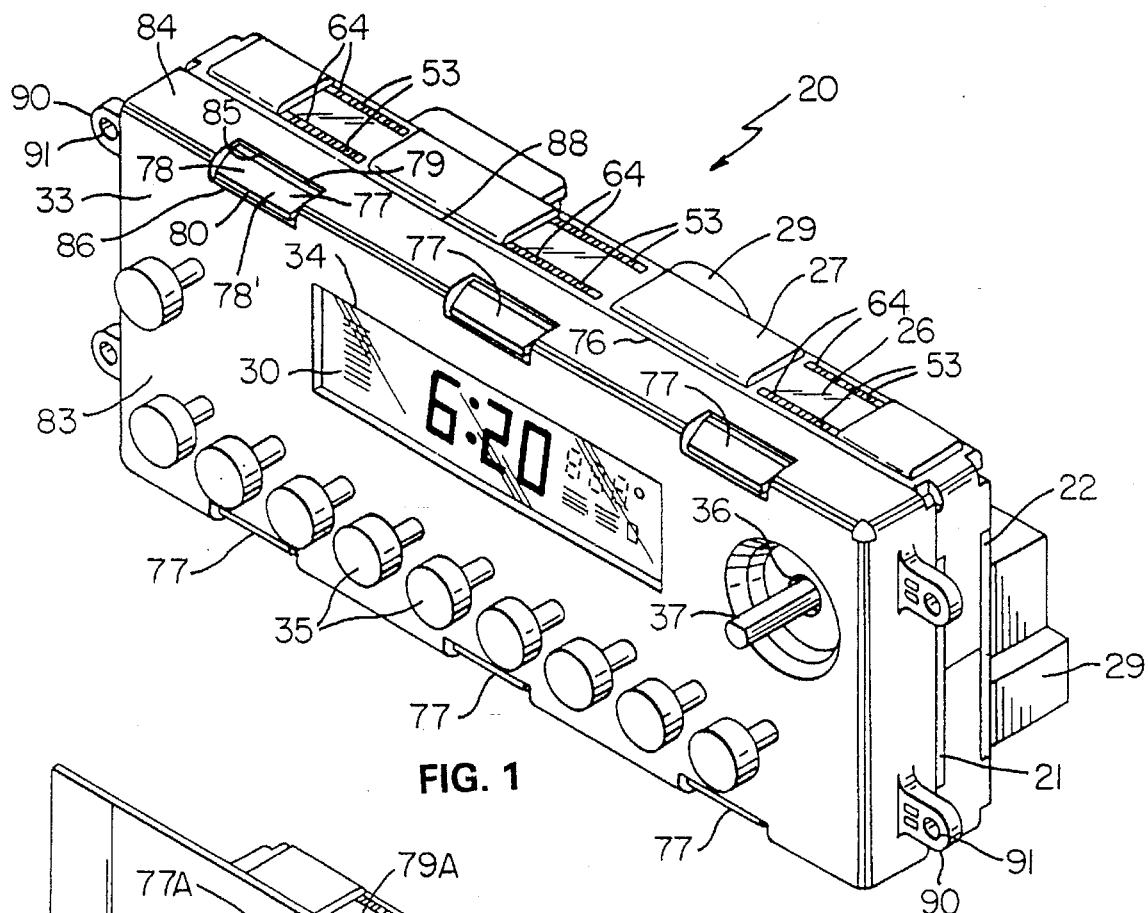
FIG. 1 is a perspective view of a control device of this invention.
Figure 2:
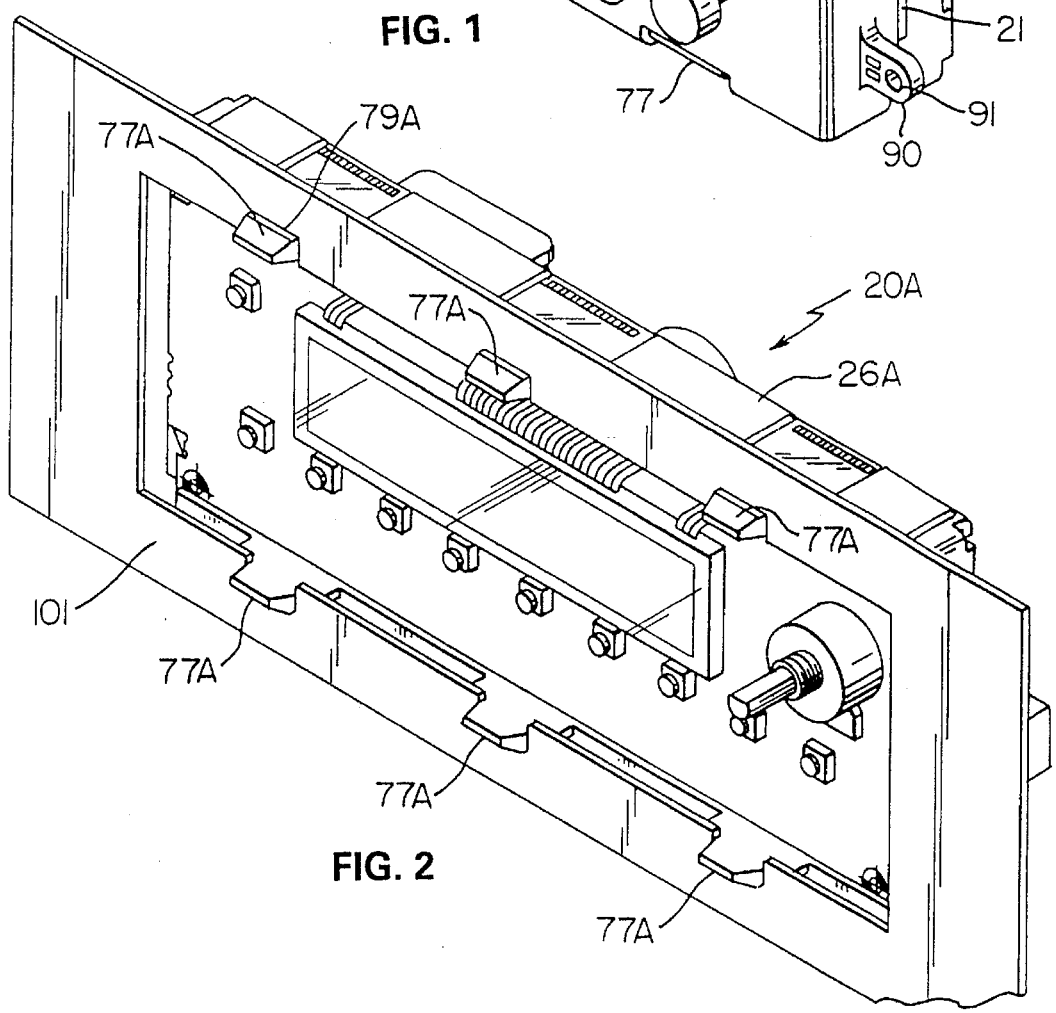
FIG. 2 is a perspective view of another control device of this invention.

While the various features of this invention are hereinafter illustrated and described as being particularly adapted to provide a control device for a cooking apparatus, it is to be understood that the various features of this invention can be utilized singly or in various combinations thereof to provide control devices for other types of apparatus as desired.

Therefore, this invention is not to be limited to only the embodiments illustrated in the drawings, because the drawings are merely utilized to illustrate one of the wide variety of uses of this invention.

Figure 9:
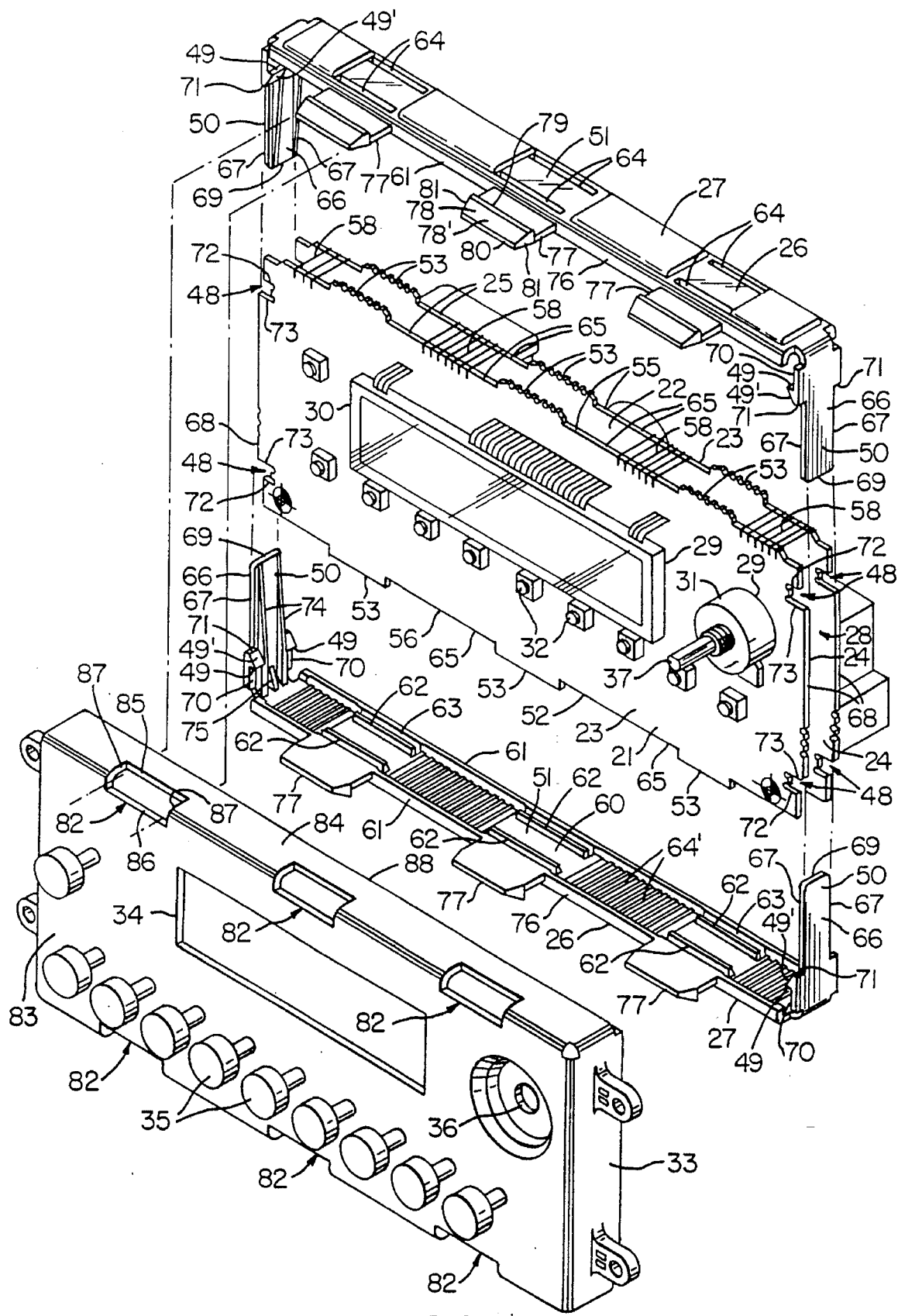
FIG. 9 is an exploded perspective view illustrating the mounting means and the front cover structure that is to be interconnected to the circuit board means of FIG. 8 to complete the control device of FIG. 1.

Referring now to FIGS. 1 and 9, a new control device of this invention is generally indicated by the reference numeral 20 and comprises two generally flat and rectangular circuit boards 21 and 22 each having a component carrying side 23 and an opposite solder side 24. Each circuit board 21 and 22 has peripheral edge means 25.

Figure 10:
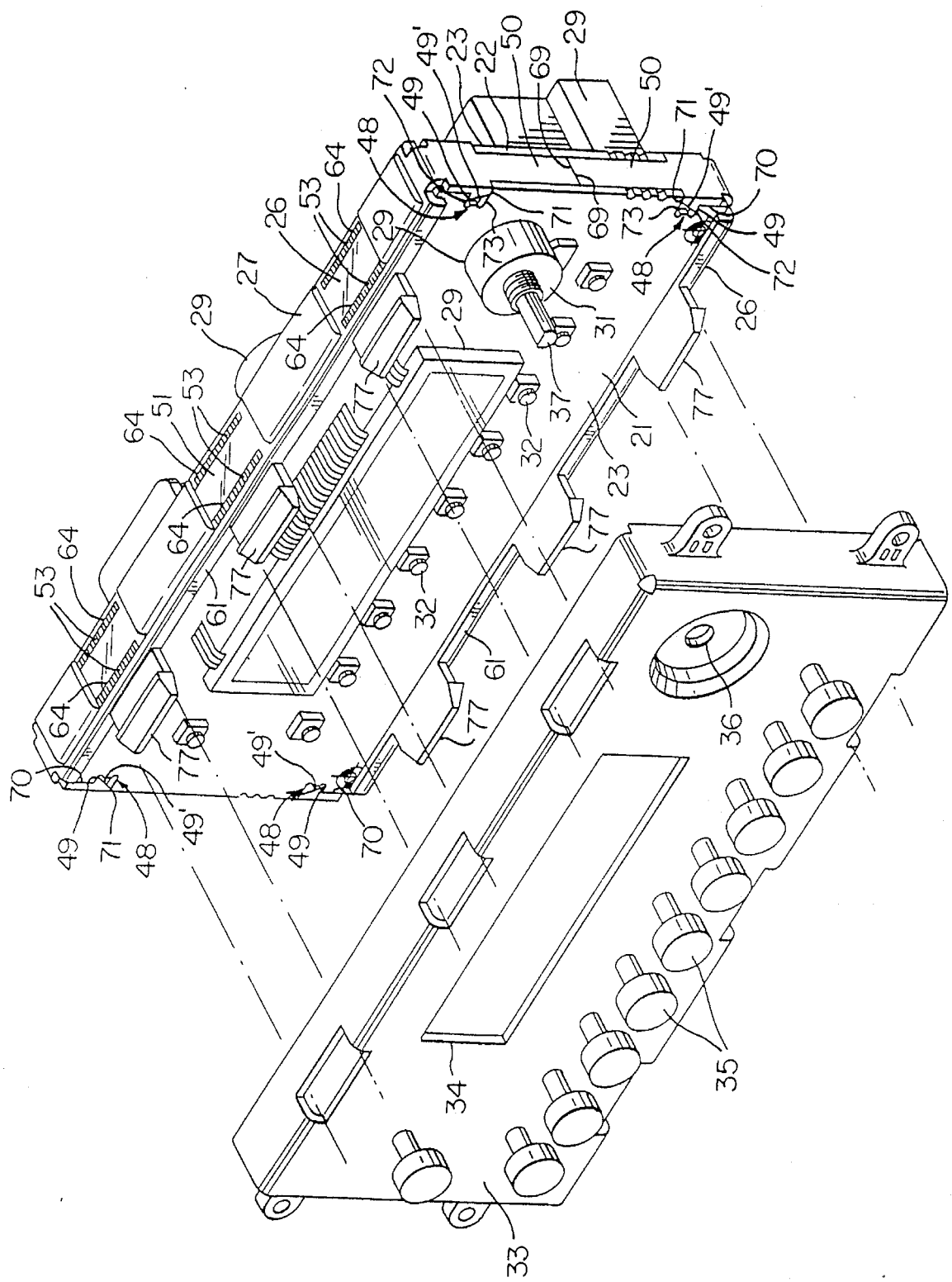
FIG. 10 is a view similar to FIG. 9 and illustrates the mounting means secured to the two circuit boards with the cover means being disposed in spaced relation thereto.

The control device 20 also comprises a pair of like U-shaped bracket members 26 which comprise mounting means or bracket means 27 that hold the two circuit boards 21 and 22 in spaced apart generally parallel relation with the solder sides 24 thereof facing each other, the bracket means 27 generally engaging and encircling the peripheral edge means 25 of the two circuit boards 21 and 22 so as to generally close a space 28 between the two circuit boards 21 and 22 around generally the entire peripheral edge means 25 thereof as illustrated in FIGS. 1 and 10.

As illustrated in FIG. 10, the control device 20 has a plurality of different components 29 mounted on the component side 23 of the circuit board 21 and a plurality of other different components 29 mounted on the component side 23 of the circuit board 22, one of the components 29 on the circuit board 21 comprising a vacuum fluorescent display and is given the reference numeral 30 in FIG. 10. The vacuum fluorescent display 30 indicates conditions that have been selected by an operator of the control device 20, such as through use of one of the components 29 that comprises a rotary switch means 31 in FIG. 10 as well as the components 29 that comprise tactile switch means 32 of the circuit board 21 all in a manner well known in the art. For example, see the Kadwell et al, U.S. Pat. No. 4,782,215, whereby this U.S. patent is being incorporated into this disclosure by this reference thereto.

Therefore, since the use of a control device for operating a cooking apparatus is well known in the art, a further description of the components 29 and their electrical circuitry provided therewith by the circuit boards 21 and 22 need not be further set forth except where believed necessary to more fully understand the various features of this invention.

The control device 20 of this invention further comprises a cover member 33 that is adapted to be secured to the mounting means 27 of the control device 20 in a manner hereinafter set forth so as to cover the component side 23 of the circuit board 21 while exposing the vacuum fluorescent display 30 through a window 34 formed therethrough as illustrated in FIG. 1. A plurality of push button means 35 are carried by the cover member 33 to respectively align with the tactile switch means 32 to operate the same when the respective push button 35 is pushed toward the circuit board 21 in a manner well known in the art. In addition, it can be seen that the cover means 33 has an opening 36 passing therethrough through which a shaft means 37 of the rotary switch 31 can project in the manner illustrated in FIG. 1 to have a suitable control knob (not shown) disposed thereon for rotating the shaft means 37 and, thus, setting the rotary switch means 29 all in a manner well known in the art. For example, see the Fowler et al, U.S. Pat. No. 4,625,084, whereby this U.S. patent is also being incorporated into this disclosure by this reference thereto.

Figure 3:
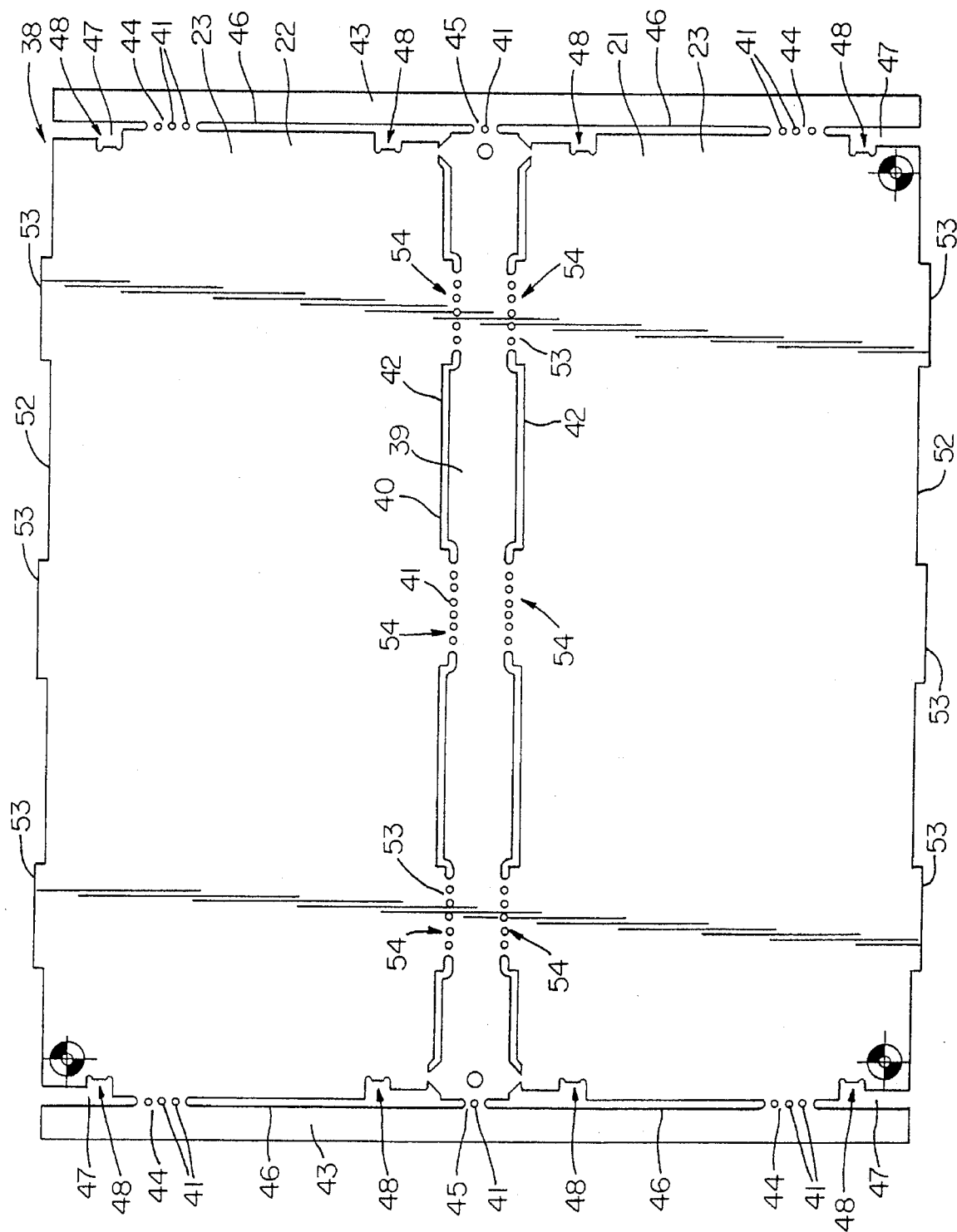
FIG. 3 is a side view of the circuit board means of the control devices of this invention.
Figure 4:
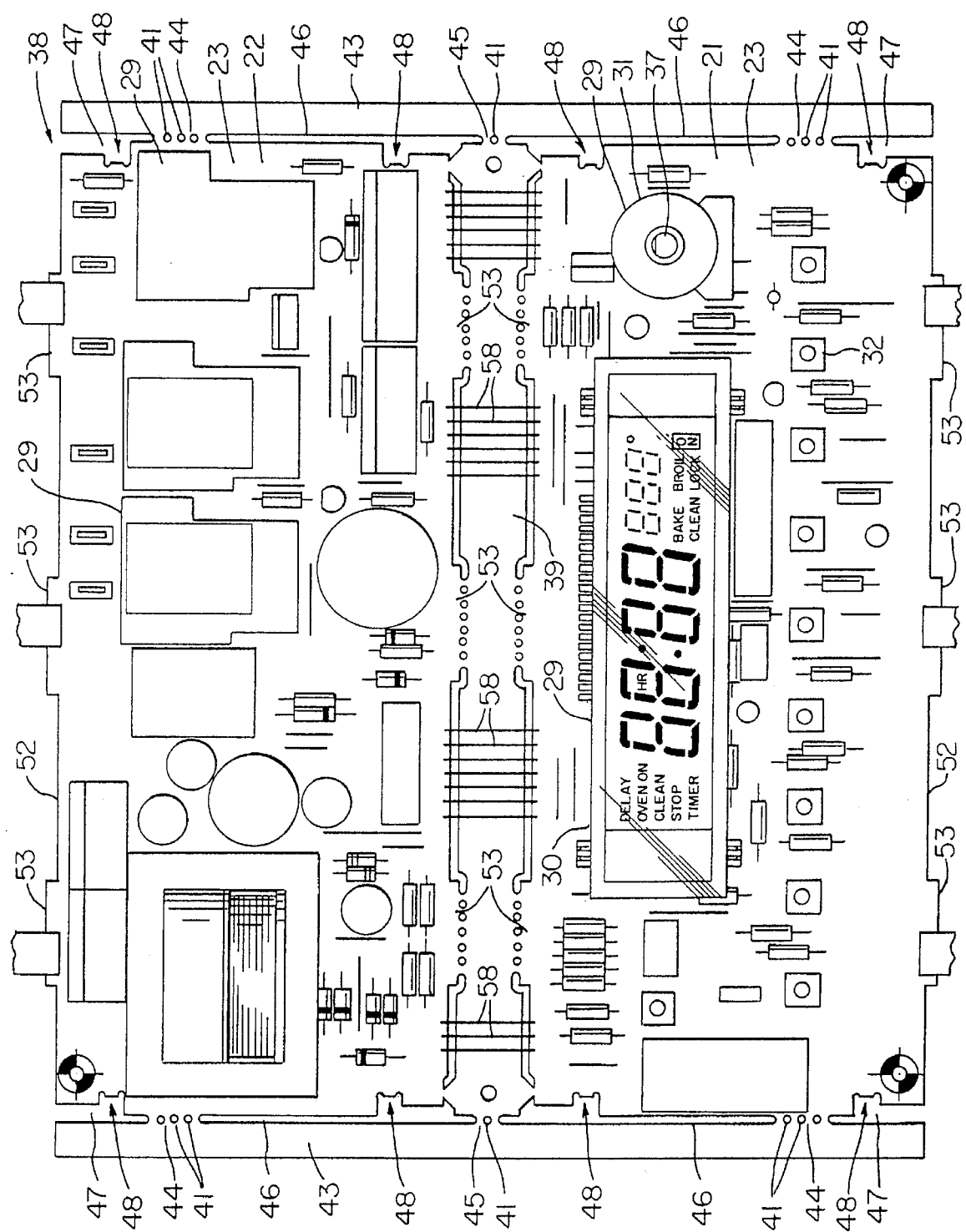
FIG. 4 is a view similar to FIG. 3 and illustrates the circuit board means of FIG. 3 having various components of the control device mounted to the component mounting side thereof.
Figure 5:
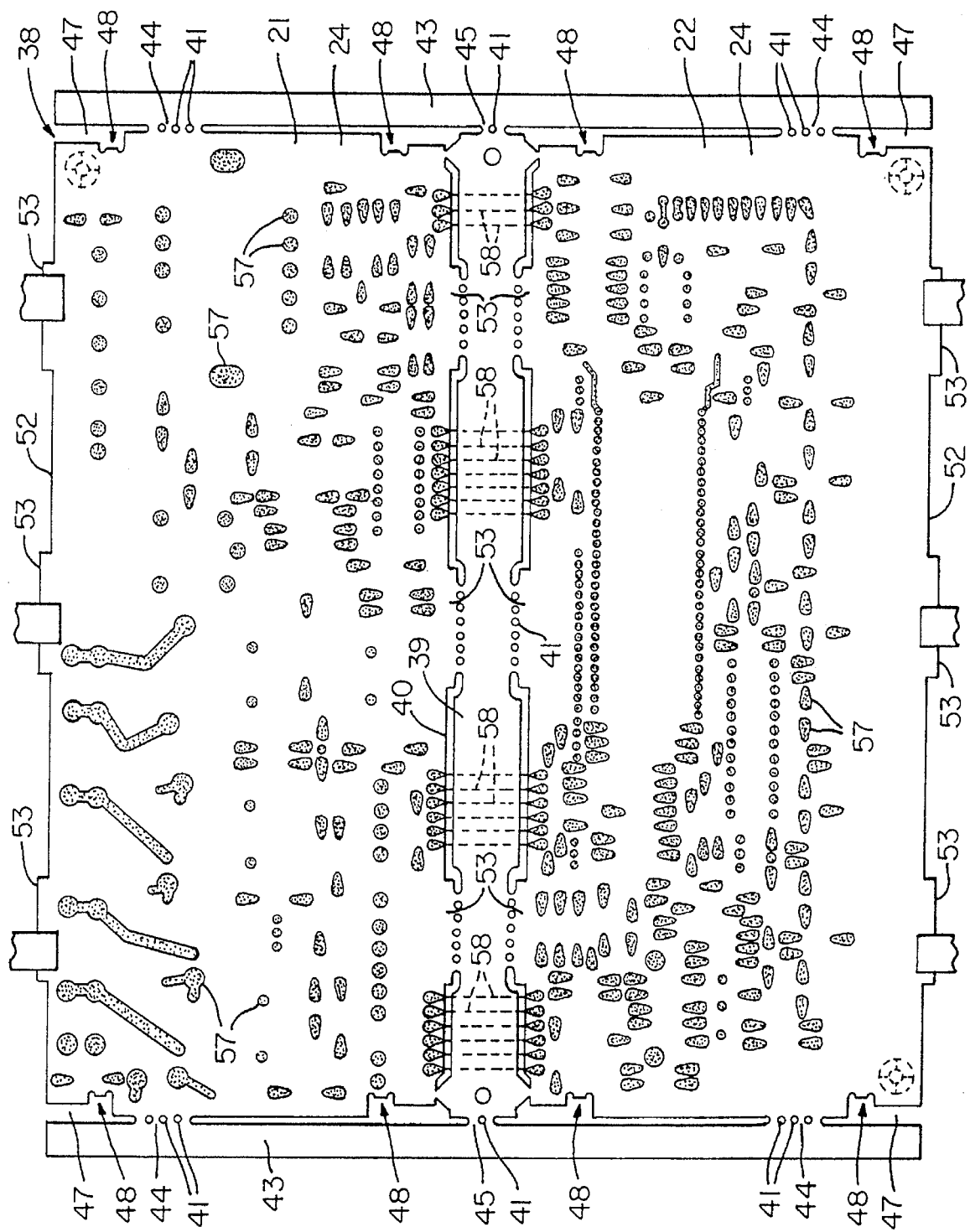
FIG. 5 is a view of the opposite side of the circuit board means of FIG. 4 and illustrates the solder on that side thereof.

The circuit boards 21 and 22 of the control device 20 of this invention are formed from a single one-piece circuit board means of conventional material that is generally indicated by the reference numeral 38 in FIGS. 3–5, the board means 38 being suitably cut to define a central breakaway section 39 that initially integrally interconnects the two circuit boards 21 and 22 together. The breakaway section 39 is defined by spaced apart cuts 40 and spaced apart holes 41 arranged throughout the length of two spaced line areas 42 as illustrated in FIG. 3. In addition, end members 43 of the circuit board 38 are each integrally joined to both circuit boards 21 and 22 in the areas 44 that have spaced apart holes 41 therethrough and to the center breakaway part. 39 in the area 45 that likewise has a breakaway hole 41 therebetween, each side section 43 being separated between the areas 44 and 45 by cutaway sections. 46 and being separated from the outer integral section 44 to the exterior of the board means 38 by cutaway sections 47.

The cutaway sections 46 and 47 in the board means 38 define notches that are generally indicated by the reference numeral 48 in the resulting peripheral edge means 25 of the boards 21 and 22 which will cooperate with respective snap-fit ledge means 49, FIG. 9, on legs 50 of the U-shaped bracket members 26, each bracket member 26 having a substantially straight cross member 51 thereof interconnecting to its respective two generally parallel legs 50 thereof at generally right angles relative thereto.

The circuit board means 38 as illustrated in FIG. 3 defines two outer edge means 52 that respectively have a plurality of outwardly directed substantially rectangular tabs or tongues 53 extending outwardly therefrom in spaced apart relation, there being three such tabs 53 for each edge 52 of the circuit board 38. The breakaway lines 42 of the central part 39 of the board means 38 define in the areas 54 thereof similar tab structure 53 which will be formed when the central section 39 is broken therefrom at the holes 41 as illustrated in FIGS. 6 and 7 whereby each circuit board 21 or 22 will have three tabs 53 along the upper and lower edges 55 and 56 thereof as illustrated in FIG. 9 with the tabs 53 of the edges 55 and 56 being in aligned relation as illustrated.

While the circuit board means 38 is in the one-piece structure illustrated in FIG. 3, the components 29 can be mounted to the component mounting sides 23 of the circuit board portions 22 and 21 in the manner illustrated in FIG. 4 by automatic machines or manually in a manner well known in the art so that subsequently solder can be applied to the solder sides 24 of the circuit board portions 21 and 22 of the circuit board means 38 as illustrated by the solder 57 in FIG. 5 also in a manner well known in the art, such as by conventional wave soldering means.

It can be seen in FIG. 4 that the two circuit board sections 21 and 22 of the one-piece circuit board means 38 are interconnected together by a plurality of wires 58 that are disposed in spaced apart relation and in clusters 59 which respectively span the cut through portions 40 of the lines 42 for the central section 39 of the board means 38, the wires 58 forming part of the electrical circuit means for the components. 29 or merely being for an interconnecting purpose of the boards 21 and 22 as will be apparent hereinafter or in a combination thereof as desired.

Figure 6:
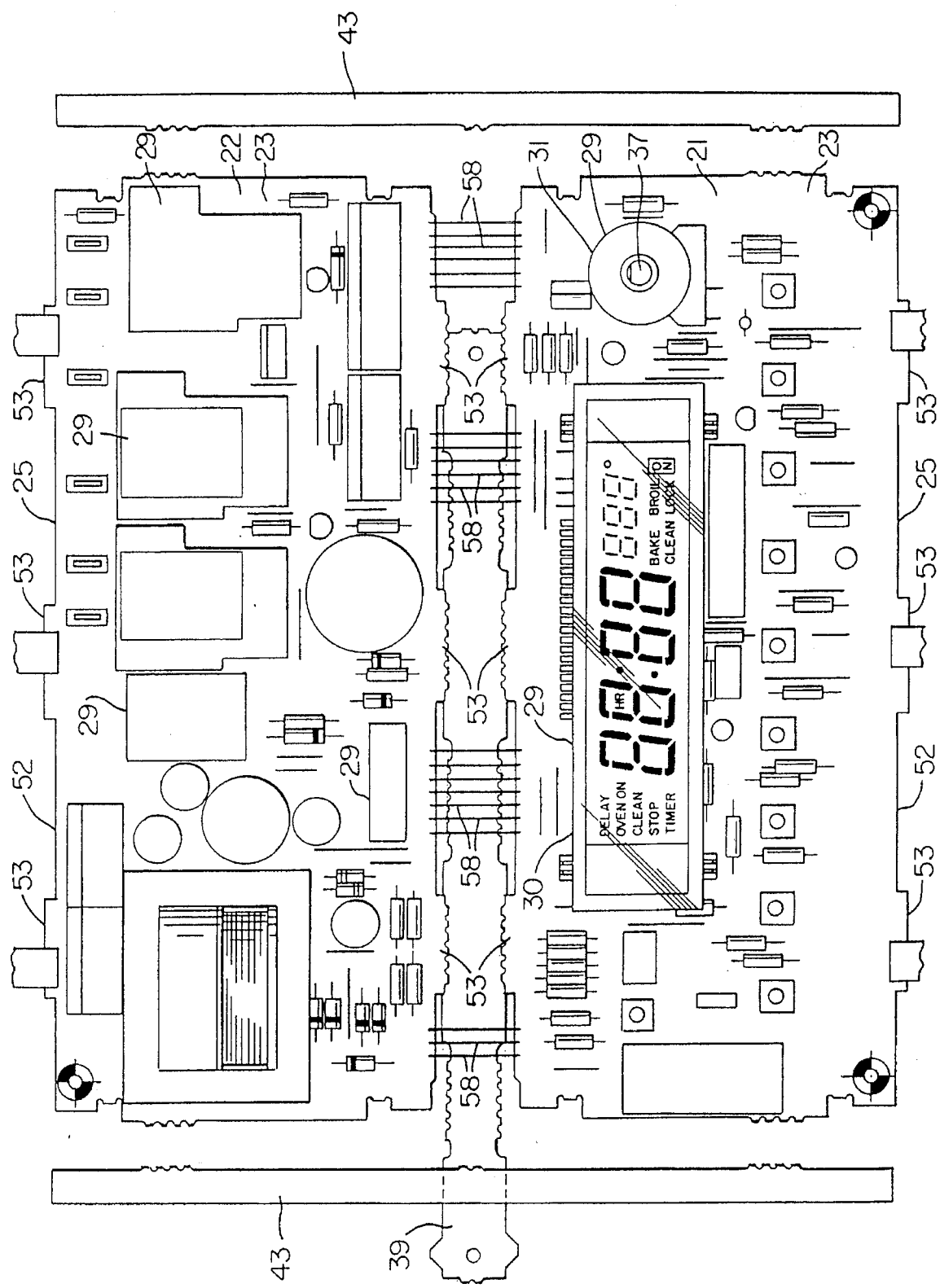
FIG. 6 is a view similar to FIG. 4 and illustrates how the circuit board means is broken to form two circuit boards interconnected together in spaced apart and coplanar relation.
Figure 7:
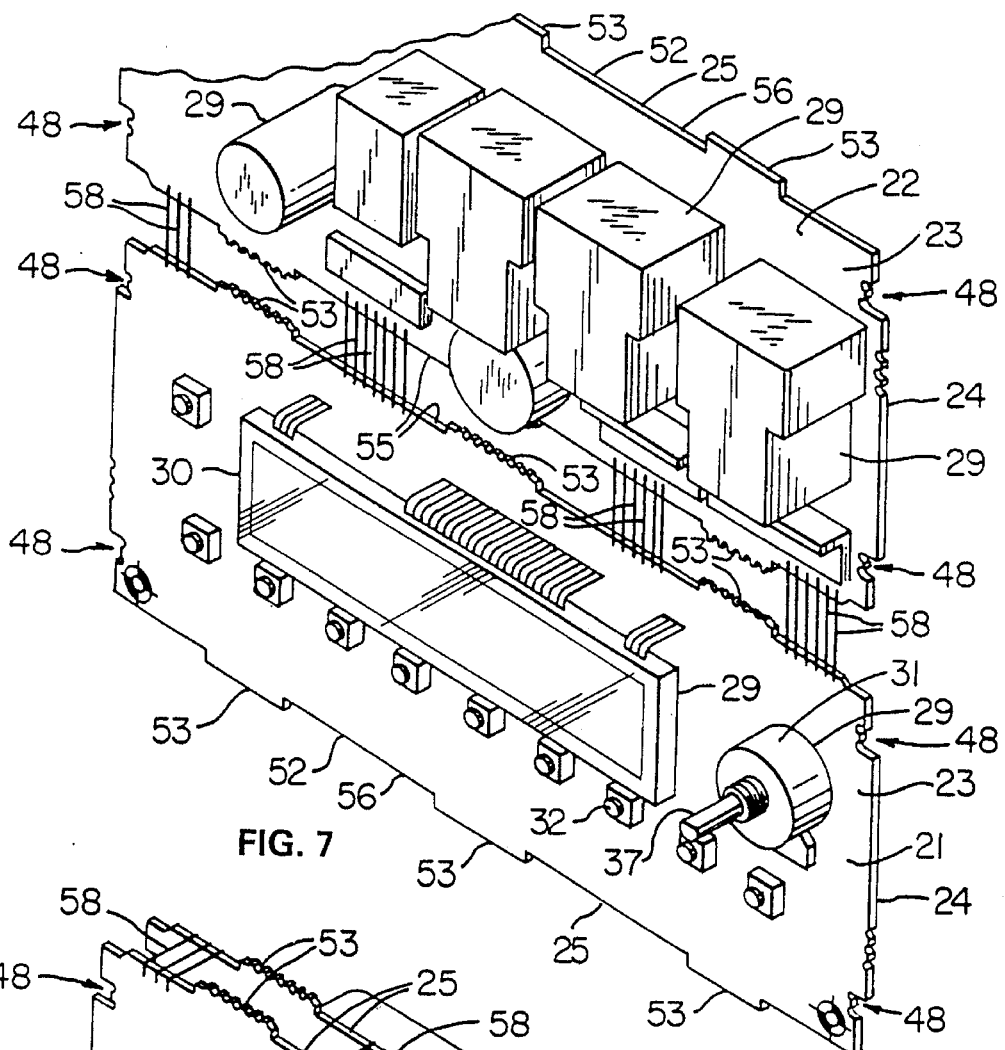
FIG. 7 is a fragmentary perspective view illustrating the circuit board means of FIG. 6 after the broken away parts thereof have been removed.

In any event, it can be seen that the components 29 in cooperation with the solder means 57 and the printed circuit means (not shown) on the board means 21 and 22 provide a functional arrangement that can be tested in the condition of FIGS. 4 and 5 before the sections 39 and 43 are broken away therefrom as illustrated in FIG. 6 by any suitable machine operation or manual operation as desired.

For example, after a suitable solder inspection of the circuit board means 38, an in circuit test can be applied to the board means 38 as well as a function test of the components 29 on the board means 38, if desired.

Thereafter, the sections 39 and 43 are broken away in any suitable manner as illustrated in FIG. 6 so that the two circuit boards 21 and 22 are now disposed in spaced apart coplanar relation and held in such condition by the wires 58.

Figure 8:
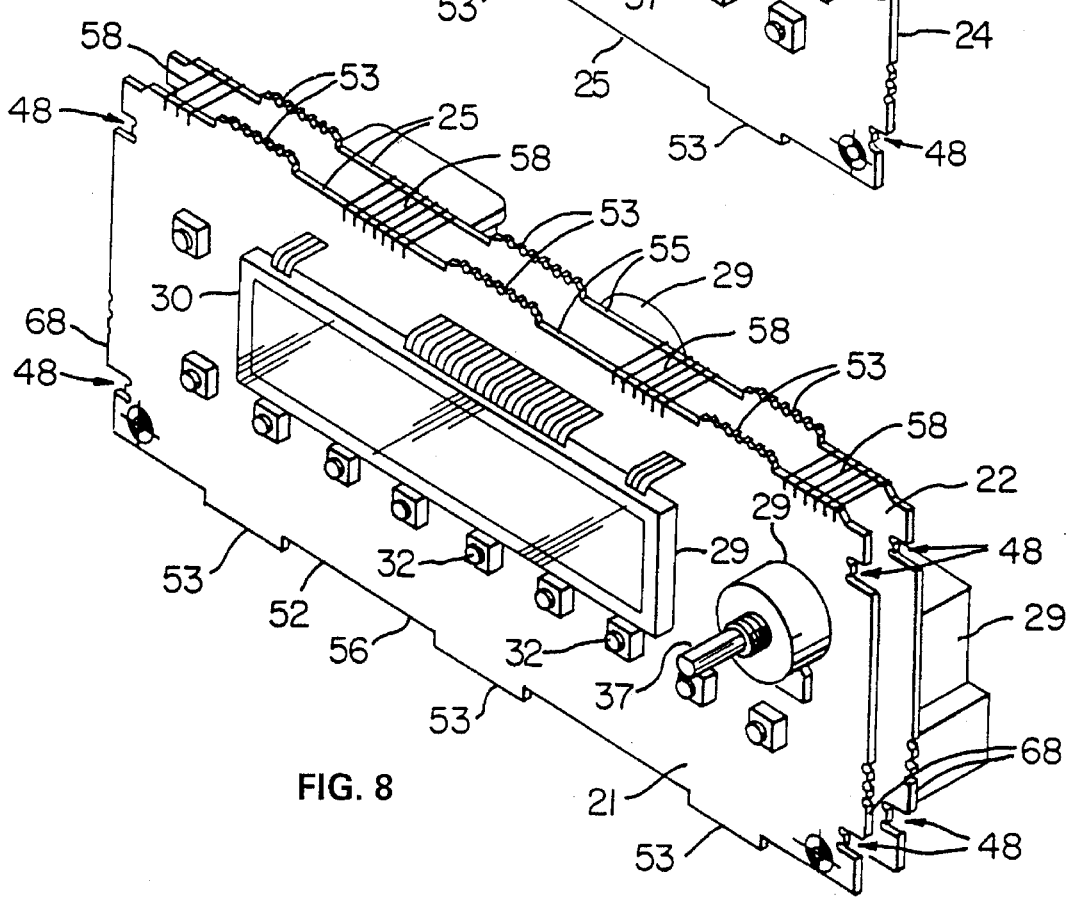
FIG. 8 is a perspective view similar to FIG. 7 and illustrates how the two interconnected circuit boards are, in effect, folded so as to be in spaced apart parallel relation.

The structure illustrated in FIG. 7 is then, in effect, folded in half so that the wires 58 are bent into the condition illustrated in FIG. 8 so that the circuit boards 21 and 22 are disposed in a generally parallel spaced apart relation as well as in aligned relation to have the U-shaped bracket members 26 subsequently interconnected thereto.

While the U-shaped bracket member 26 of this invention can be formed of any suitable material, one working embodiment thereof is formed of a plastic material sold by the General Electric Company of Schenectady, N.Y. as General Electric Lexan ML 4291 that is molded into the configuration illustrated in FIG. 9 so that the cross member 51 and legs 50 thereof have a nominal wall thickness of approximately 0.075 of an inch with the cross member 51 being approxiamtely 6.850 inches long and the legs 50 being approximately 1.485 inches long, the cross member 51 and legs 50 being respectively approximately 0.655 of an inch and approximately 0.510 of an inch wide.

However, it is to be understood that the bracket means 27 of this invention can have other configurations and dimensions as desired and can be formed of materials other than plastic materials, if desired.

The cross member 51 of each U-shaped bracket member 26 has an inside surface 60 provided with upstanding flange means 61 at each side edge means thereof that cooperate with spaced flanges 62 to define channel areas 63 that respectively lead to slot means 64 passing through the cross member 51 so as to receive respective tabs 53 of the particular circuit board 21 or 22 therein as illustrated in FIG. 10 whereby not only is each tab 53 held within its respective slot 64, but also that tab 53 is held in the respective channel 63 between the flange means 61 and 62 to fully support the peripheral edge means 25 of the circuit boards 21 and 22 along the top and bottom edges 55 and 56 thereof as illustrated in FIG. 10.

The surface 60 of the cross member 51 is provided with a plurality of ribs 64' between the flanges 61 as illustrated in FIG. 9 for a purpose hereinafter set forth.

The flanges 61 of the cross members 51 overlap the non-tabbed portions 65 of the top and bottom edges 55 and 56 of the peripheral edge means 25 of the circuit boards 21 and 22 that have the non-tabbed edges 65 disposed against the ribs 64' when the tabs 53 are fully received in their respective slots 64 as illustrated.

Each leg 50 of each U-shaped bracket member 26 has two snap-fit ledge means 49 and a reduced free end tongue 66 that has edges 67 disposed perpendicular to the inboard sides of the ledge means 49 but being adapted to be engaged by the peripheral edge means 25 of the circuit boards 21 and 22 at the end edges 68 thereof all the way to the free end edges 69 of the tongues 66 which will be disposed in substantially abutting relation with the end edges 69 of the legs 50 of the other U-shaped bracket member 26 as illustrated in FIG. 10 whereby the U-shaped bracket members 26 substantially close the space 28 between the two circuit boards 21 and 22 when the two U-shaped bracket members 26 are fully disposed in place on the circuit boards 21 and 22.

The snap-fit ledge means 49 each has an inner flat surface 70 and an outer flat surface 71 interconnected together by a camming flat surface 49' and which are adapted to respectively snap into a respective notch 48 of the respective circuit board 21 or 22 that defines opposed spaced apart flat edges 72 and 73 which will be respectively engaged by the surfaces 70 and 71 of the snap-fit ledge means 49 in the manner illustrated in FIG. 10 so as to interconnect the respective leg 50 of the respective U-shaped bracket member 26 to both circuit boards 21 and 22, the cam surfaces 49' of the snap-fit ledge means 49 camming the respective leg 50 of the respective bracket member 26 outwardly as the respective bracket member 26 is nested with the respective ends 55 or 56 of the circuit boards 21 and 22 until the ledge means 49 align with the respective notches 48 and snap therein through the natural spring force of the legs 50 to spring back into uncammed condition thereof.

If desired, each leg 50 can be supported to its respective cross member 51 by reinforcing rib means 74 and 75 as illustrated in FIG. 9.

Therefore, it can be seen that regardless of which U-shaped bracket member 26 is provided for the top or bottom edges 55 and 56 of the circuit boards 21 and 22, the bracket members 26 are symmetrical or like and can be snap-fit thereto whereby the wires 58 at the top edge means 55 of the boards 21 and 22 will be held in spaced relation by the ribs 64' passing therebetween as the tabs 53 are received in the slots 64 and the snap-fit ledges 49 are snapped into the cooperating notches 48 in a simple and effective manner by the method of this invention as previously described.

Thus, it can be seen that the U-shaped bracket members 26 not only hold the circuit boards 21 and 22 in the spaced apart parallel relation thereof, but also the U-shaped bracket members 26 support the peripheral edge means 25 of the circuit boards 21 and 22 almost completely around the entire circuit boards 21 and 22 so as to prevent breaking of the same if forces are applied thereto, such as at the corners thereof or anywhere along the same. Therefore, a relatively solid structure is provided by the interconnected bracket members 26 and circuit boards 21 and 22.

In addition, it can be seen that the bracket members 26 generally engage and encircle the peripheral edge means 25 of the circuit board means 21 and 22 so as to generally close the space 28 between the two circuit board means 21 and 22 generally around the entire peripheral edge means 25 thereof so as to prevent dirt, grease, etc. from entering the space 28 therebetween.

The thus described control device 20 of this invention is adapted to have the cover 33 fastened thereto in a manner now to be described.

The U-shaped bracket members 26 of the control device 20 each has a front edge 76 provided with a plurality of tabs 77 extending outwardly therefrom in spaced apart relation and each having a snap-fit ledge means 78 defining an inside flat surface 79 and an outside flat surface 80 interconnected together by a flat camming surface 78' as well as by opposed side edges 81. Such snap-fit ledge means 78 of each tab 77 is adapted to be received in a cooperating slot means 82 formed in the cover member 33 that comprises a rectangular cup-shaped structure that has a front wall 83 and sidewalls 84, each slot 82 defining an edge 85 on the sidewall 84 and an edge 86 on the front wall 83 while defining side edges 87 on both the front wall 83 and the sidewall 84 so as to cooperate with a respective tab means 77 of the bracket structure 27.

In particular, as the cover member 33 is pushed toward the component side 23 of the circuit board 21 of the control device 20 in the manner illustrated in FIG. 10, the tabs 77 are respectively received in the slot means 82 and the cam surfaces 78' of the ledge means 78 thereof cam on the inside surface means of the sidewall means 84 of the cover member 33 until the surfaces 79 of the tabs 77 align with the edges 85 of the slots 82 to permit the surfaces 79 to snap-fit past the edges 85 under the spring back force of the tabs 77 at approximately the same time that the rear edge 88 of the sidewall 84 of the cover member 33 engages the front edge 76 of the flange 61 of the respective bracket member 26 as illustrated in FIG. 1, the edges 86 in the cover member 33 being sufficiently spaced from the flat side 79 of the respective tab 77 to permit such flexure of the tabs 77 until the edges 79 thereof snap over the edges 85 of the cover member 33.

In this manner, it can be seen that it is a relatively simple method of this invention to snap the cover member 33 in place on the control device 20 to cover the component side 23 of the circuit board 21 as illustrated in FIG. 1.

If desired, the cover member 33 can be provided with side mounting tabs 90 that have openings 91 passing therethrough for mounting the control device 20 to any desired structure of the cooking apparatus utilizing the same.

While the control device 20 previously described has a particular cover member 33 snap-fit thereto as previously set forth, it is to be understood that the control device 20 could be secured to other structure as desired.

Therefore, reference is now made to FIGS. 2 and 11–13 wherein another control device of this invention is generally indicated by the reference numeral 20A and parts thereof similar to parts of the control device 20 previously described are indicated by like reference numerals followed by the reference letter "A".

The control device 20A is substantially identical to the control device 20 previously set forth except that the tabs 77A extending from the bracket members 26A each has a pair of shoulders 100 extending outwardly beyond the snap-fit ledge means 78A thereof and being spaced rearwardly from the snap-fit edges 79A by a distance that is substantially equal to the thickness of a mounting plate means 101 to which the control device 20A is to be interconnected.

In particular, the mounting plate 101 is formed of any suitable material and has a substantially rectangular opening 102 passing therethrough, the plate 101 comprising a substantially flat member having opposed flat parallel sides 103 and 104, such as provided by a metallic plate or the like. The rectangular opening 102 in the plate 101 defines a plurality of rectangular notches 105 that respectively define edges 106 around which a respective snap-fit ledge means 78A of the control device 20A can snap in the manner illustrated in FIGS. 12 and 13 while the shoulders 100 of the respective tab means 77A abut against the .side 104 of the plate 103 in the manner illustrated in FIG. 13 to hold the plate 101 between the surfaces 79A and shoulders 100.

Thus, it can be seen that the control device 20A is adapted to be snap-fit to the mounting plate 101 in a simple and effective manner so that the plate 101 can be secured to the desired structure of a cooking apparatus or the like that has its own cover means for covering the facing component side 23A of the circuit board 21A.

Figure 14:
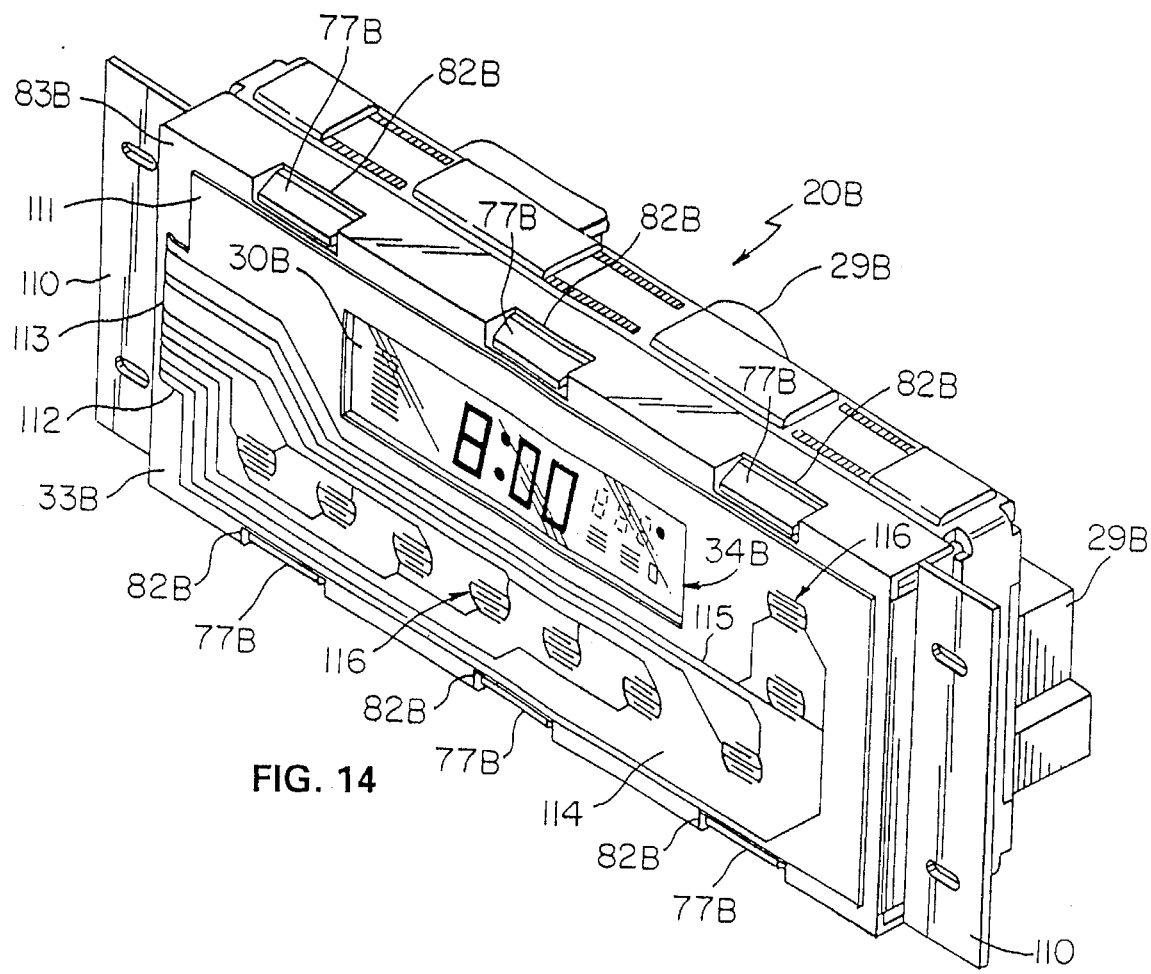
FIG. 14 is a perspective view similar to FIG. 1 and illustrates another control device of this invention.
Figure 15:
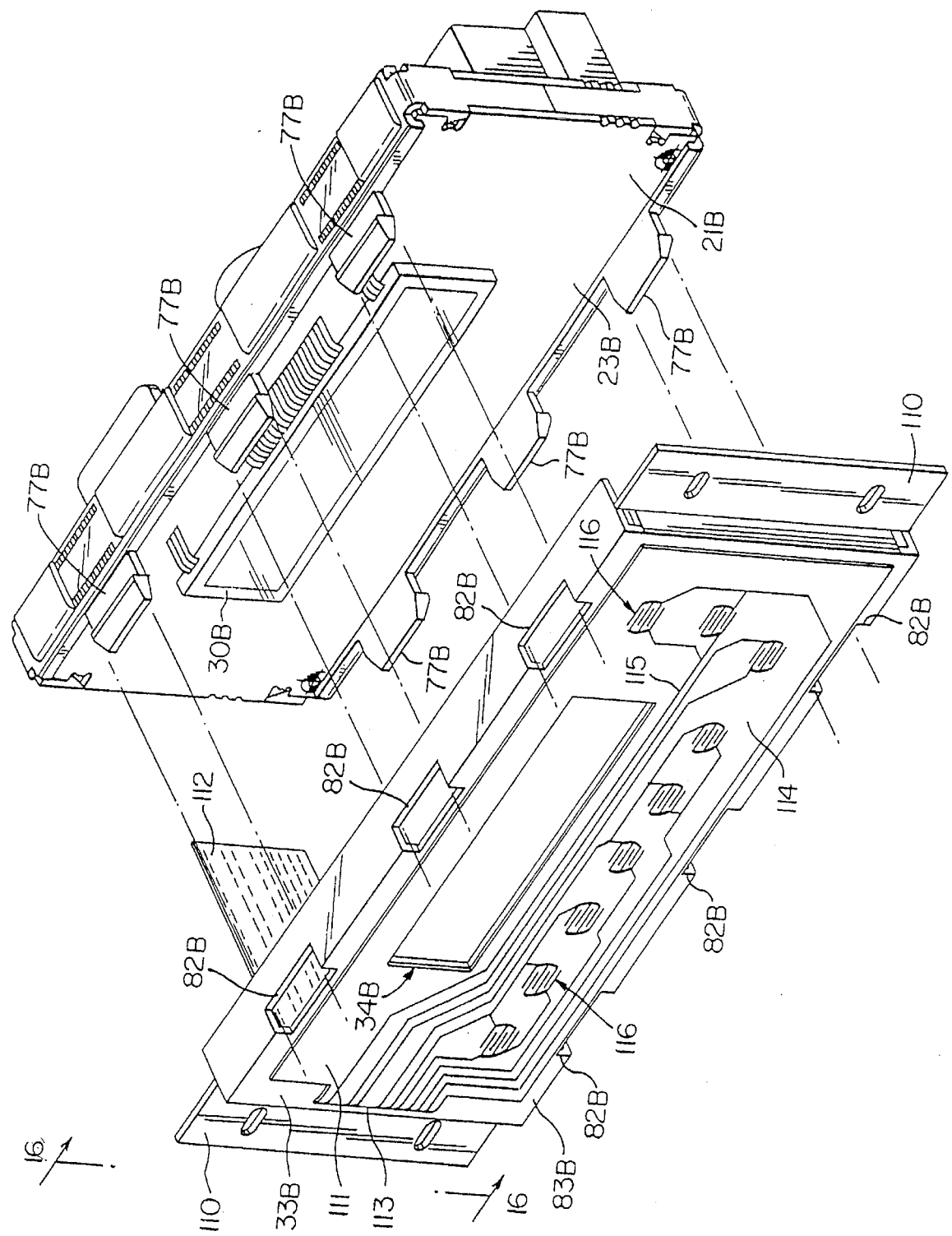
FIG. 15 is an exploded perspective view of certain parts of the control device of FIG. 14.

Another control device of this invention is generally indicated by the reference numeral 20B in FIGS. 14 and 15 and parts thereof similar to the parts of the control devices 20 and 20A previously described are indicated by like reference numerals followed by the reference letter "B".

As illustrated in FIGS. 14 and 15 it can be seen that the control device 20B of this invention is substantially identical to the control device 20 previously described except that the component side 23B of the circuit board 21B does not have the rotary switch component 31 nor the tactile switch means 32 mounted thereon even though the same has the vacuum fluorescent display means 30B mounted thereon (as well as other components 29B that are not shown). This is because a different cover member 33B is utilized with the control device 20B and has slots 82B therein for cooperating with the tangs 77B of the control device 20B to be snap-fit thereto in the manner previously described so that the fluorescent display 30B is exposed at a window 34B of the cover member 33B.

While the cover member 33B can be formed of any suitable material, the same can be formed of metallic material and have mounting flanges 110 provided at opposite ends thereof as illustrated.

Figure 16:
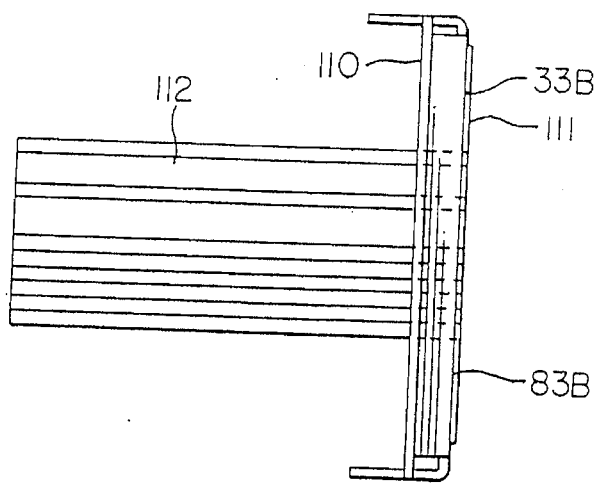
FIG. 16 is a side view of the cover member of the control device of FIG. 14.

In addition, the cover means 33B has a sheet 111 of electrically insulating material, such as plastic, secured to the front plate 83B thereof and is provided with a tab 112 which is adapted to pass through a slot 113 in the front plate 83B of the cover member 33B to extend rearwardly therefrom as illustrated in FIG. 16 and be coupled with the circuit board means 21B and/or 22B in a manner to electrically interconnect with certain of the electrical circuitry thereof.

For example, the front surface 114 of the sheet 111 has printed conductive circuit means 115 thereon which is formed in a spaced pattern in areas 116 to define switch means that are completed when a person presses a finger thereagainst in a bridging manner to operate as switch means. Of course, tactile conductive means can be utilized to provide the bridging relation for the areas 116 in a manner well known in the art.

In any event, it can be seen that the printed circuit means 115 on the sheet 111 interconnect the areas 116 through the tab means 112 to the circuit means on the board means 21B and/or 22B.

Therefore, it can be seen that various cover means or mounting plates can be secured to the control devices of this invention and that the same can be snap-fit thereto by utilizing unique means of the mounting bracket means of the control devices of this invention in the manner previously described.

While the various control devices of this invention have two like circuit boards, it is to be understood that more than two circuit boards can be provided, the circuit boards can have other configurations than rectangular and each board can have a different configuration in the same control device, if desired.

In any event, the bracket members of this invention act as trusses to support parallel layers or circuit boards and prevent warping thereof when pressure is applied perpendicular to the parallel surfaces thereof. For example, when placing fast on terminals and/or 1/0 headers near the outer perimeters of the circuit boards, the bracket members of this invention provide support for the push on insertion forces and/or pull off extraction forces of such interfacing wiring terminals. In addition, the support provided by the bracket members of this invention to the circuit boards prevent the forces being applied thereto by an abusive operator pushing on the different switch means of the keyboard thereof and/or using the rotary switch means thereof from breaking the circuit boards as it has been found that such abusive forces or even normal use forces tend to break the poorly supported circuit boards of prior known control devices.

Accordingly, it can be seen that this invention not only provides a new control device, but also this invention provides a new method of making such a control device.

While the forms and methods of this invention now preferred have been illustrated and described as required by the Patent Statute, it is to be understood that other forms and method steps can be utilized and still fall within the scope of the appended claims wherein each claim sets forth what is believed to be known in each claim prior to this invention in the portion of each claim that is disposed before the terms "the improvement" and sets forth what is believed to be new in each claim according to this invention in the portion of each claim that is disposed after the terms "the improvement" whereby it is believed that each claim sets forth a novel, useful and unobvious invention within the purview of the Patent Statute.

What is claimed is:

1. In a control device comprising two circuit boards each having a component carrying side and an opposite solder side, each said circuit board having peripheral edge means, and mounting means holding said two circuit boards in spaced apart relation with certain sides thereof facing each other, the improvement wherein said mounting means comprises bracket means engaging and encircling said peripheral edge means of said two circuit boards so as to close the space between said two circuit boards around the entire said peripheral edge means thereof.

2. A control device as set forth in claim 1 wherein said bracket means comprise a plurality of symmetrical bracket members.

3. A control device as set forth in claim 1 wherein said bracket means has means snap-fitted to said two circuit boards.

4. A control device as set forth in claim 1 wherein said bracket means comprises two like U-shaped bracket members each having a cross member and a pair of spaced apart legs provided with free ends, said bracket members having said free ends of said legs in an abutting relation.

5. A control device as set forth in claim 4 wherein each said leg of each said bracket member is snap-fitted to each said circuit board.

6. A control device as set forth in claim 5 wherein each said cross member of each said bracket member has slot means therethrough, each said circuit board having tangs extending into respective slot means of said bracket members.

7. A control device as set forth in claim 6 wherein said two circuit boards were initially a one-piece member that was subsequently broken apart into said two circuit boards, some of said tangs of said two circuit boards having been created by the breaking apart of said one-piece member.

8. A control device as set forth in claim 7 wherein said one-piece member was effectively folded in half to produce said two circuit boards so that like sides thereof face each other.

9. A control device as set forth in claim 8 wherein said like sides comprise said solder sides of said two circuit boards.

10. A control device as set forth in claim 1 and comprising a cover member that covers at least part of a non-facing side of one of said two circuit boards, said bracket means having means snap-fitted to said cover member.

11. A control device as set forth in claim 1 wherein said bracket means has means for snap-fitting to another structure.

12. In a control device comprising two circuit boards each having a component carrying side and an opposite solder side, each said circuit board having peripheral edge means, and mounting means holding said two circuit boards in spaced apart relation with certain sides thereof facing each other, the improvement wherein said mounting means comprises two like U-shaped bracket members each having a cross member and a pair of spaced apart legs provided with free ends facing said free ends of the other bracket member, said cross member and said legs of each bracket member engaging said peripheral edge means of said two circuit boards.

13. A control device as set forth in claim 12 wherein each said leg of each said bracket member is snap-fitted to each said circuit board.

14. A control device as set forth in claim 13 wherein each said cross member of each said bracket member has slot means therethrough, each said circuit board having tangs extending into respective slot means of said bracket members.

15. A control device as set forth in claim 12 and comprising a cover member that covers at least part of a non-facing side of one of said two circuit boards, said bracket means having means snap-fitted to said cover member.

16. A control device as set forth in claim 12 wherein said bracket means has means for snap-fitting to another structure.

17. In a method of making a control device comprising two circuit boards each having a component carrying side and an opposite solder side, each said circuit board having peripheral edge means, and mounting means holding said two circuit boards in spaced apart relation with certain sides thereof facing each other, the improvement comprising the step of forming said mounting means to comprise bracket means that engage and encircle said peripheral edge means of said two circuit boards so as to close the space between said two circuit boards around the entire said peripheral edge means thereof.

18. A method as set forth in claim 17 and comprising the step of snap-fitting said bracket means to said two circuit boards.

19. A method as set forth in claim 17 and comprising the steps of forming said two circuit boards to initially be a one-piece member, thereafter, breaking said one-piece member into said two circuit boards that are interconnected together by wire means in a spaced apart side-by-side relation thereof, and then folding said two circuit boards at said wire means thereof into said spaced apart relation thereof.

20. A method as set forth in claim 17 and comprising the step of snap-fitting a cover member to said bracket means so that said cover member covers at least part of a non-facing side of one of said two circuit boards.

* * * * *